(12) United States Patent
Poulsen

(10) Patent No.: US 7,772,505 B2
(45) Date of Patent: Aug. 10, 2010

(54) ELECTROMAGNETIC INTERFERENCE (EMI) SHIELDING APPARATUS AND RELATED METHODS

(75) Inventor: Michael Poulsen, House Springs, MO (US)

(73) Assignee: Laird Technologies, Inc., Chesterfield, MO (US)

( * ) Notice: Subject to any disclaimer, the term of this patent is extended or adjusted under 35 U.S.C. 154(b) by 161 days.

(21) Appl. No.: 12/196,875

(22) Filed: Aug. 22, 2008

(65) Prior Publication Data

US 2009/0211802 A1 Aug. 27, 2009

Related U.S. Application Data

(60) Provisional application No. 61/030,896, filed on Feb. 22, 2008.

(51) Int. Cl.
*H05K 9/00* (2006.01)

(52) U.S. Cl. .................. 174/382; 174/387; 361/818

(58) Field of Classification Search .................. 174/377, 174/382, 384, 387; 361/816, 818
See application file for complete search history.

(56) References Cited

U.S. PATENT DOCUMENTS

| | | | |
|---|---|---|---|
| 2,739,733 A | 3/1956 | Larson | |
| 2,899,107 A | 8/1959 | Doepke et al. | |
| 3,029,357 A | 4/1962 | Williams | |
| 3,371,840 A | 3/1968 | Schlager et al. | |
| 4,816,613 A | 3/1989 | Ito et al. | |
| 5,416,668 A * | 5/1995 | Benzoni ..................... | 361/816 |
| 5,538,903 A * | 7/1996 | Aramoto et al. .............. | 438/94 |
| 5,566,055 A | 10/1996 | Salvi, Jr. | |
| 5,586,600 A | 12/1996 | Cribari | |
| 5,608,188 A * | 3/1997 | Choon et al. ................. | 174/372 |
| 6,121,546 A * | 9/2000 | Erickson et al. ............. | 174/366 |
| 6,194,653 B1 | 2/2001 | McMiller et al. | |
| 6,724,641 B1 * | 4/2004 | Hwang ........................ | 361/818 |
| 6,867,969 B2 * | 3/2005 | Hwang ........................ | 361/690 |
| 7,006,357 B2 | 2/2006 | Otani et al. | |
| 7,262,369 B1 | 8/2007 | English | |
| 7,285,732 B2 | 10/2007 | Vinokor et al. | |
| 7,612,299 B2 * | 11/2009 | Chen .......................... | 174/359 |
| 2007/0094977 A1 | 5/2007 | Zuehlsdorf et al. | |
| 2007/0139904 A1 | 6/2007 | English et al. | |
| 2007/0210082 A1 | 9/2007 | English et al. | |

\* cited by examiner

*Primary Examiner*—Hung V Ngo
(74) *Attorney, Agent, or Firm*—Harness, Dickey & Pierce, P.L.C.

(57) ABSTRACT

According to various aspects, exemplary embodiments are provided of shielding apparatus suitable for use in providing electromagnetic interference shielding for one or more electrical components on a substrate. In one exemplary embodiment, a shielding apparatus generally includes first and second walls. The first wall includes laterally spaced-apart detent protrusions. The second wall includes an edge portion disposed relative to the first wall such that an interface between the edge portion of the second wall and the first wall is substantially sealed against the ingress and/or egress of electromagnetic interference through the interface. The edge portion of the second wall is engaged generally between and laterally confined by the laterally spaced-apart detent protrusions of the first wall, such that the laterally spaced-apart detent protrusions inhibit movement of the second wall relative to the first wall. Accordingly, this helps retain the interface between the edge portion of the second wall and the first wall substantially sealed against the ingress and/or egress of electromagnetic interference through the interface.

38 Claims, 6 Drawing Sheets

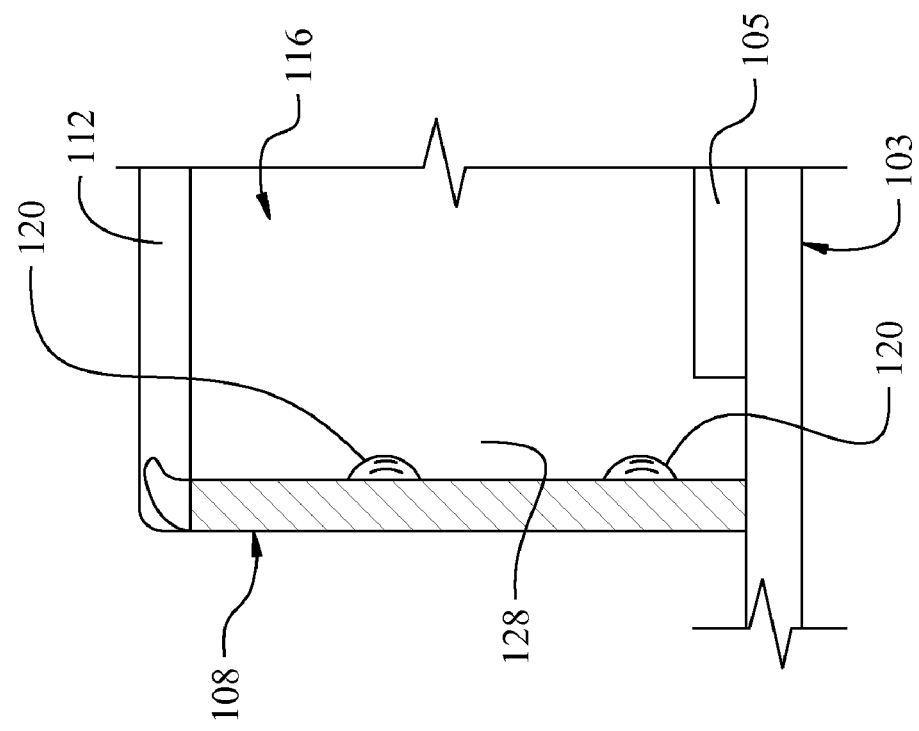
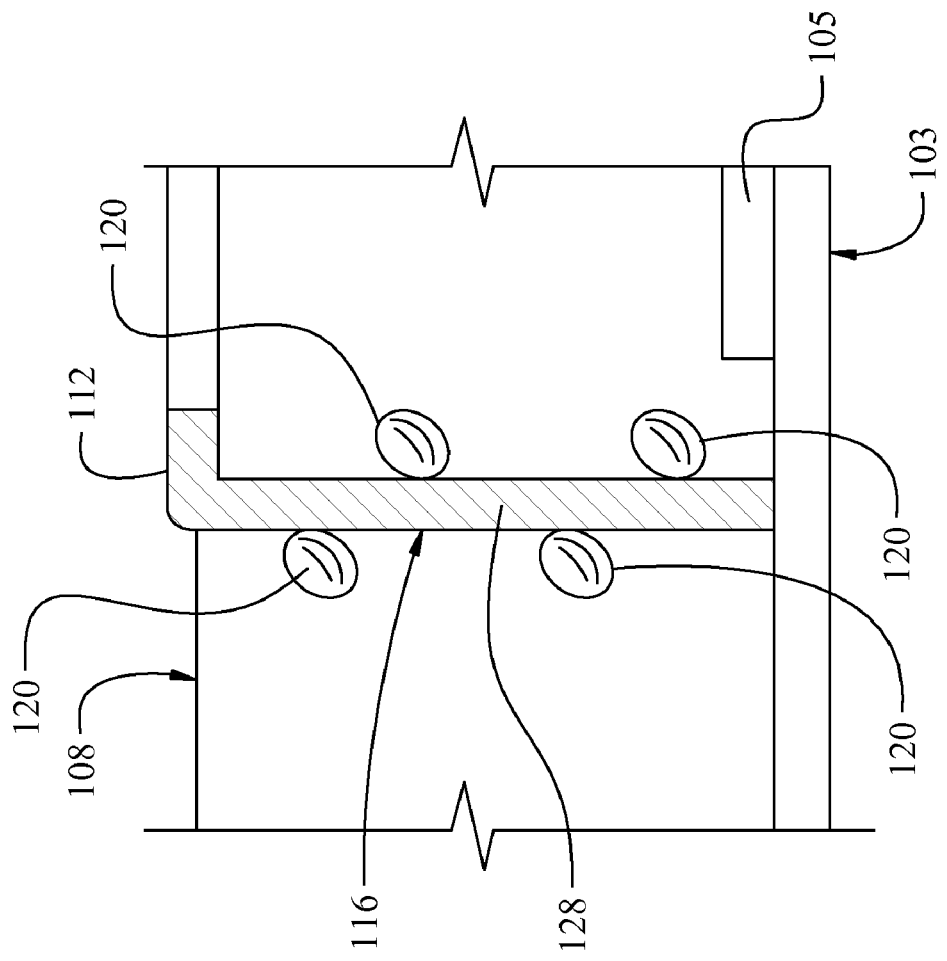

ELECTROMAGNETIC INTERFERENCE (EMI) SHIELDING APPARATUS AND RELATED METHODS

CROSS-REFERENCE TO RELATED APPLICATION

This application claims the benefit of U.S. Provisional Application No. 61/030,896 filed Feb. 22, 2008. The entire disclosure of the above provisional application is incorporated herein by reference.

FIELD

The present disclosure relates generally to electromagnetic interference (EMI) shielding apparatus and related methods.

BACKGROUND

The statements in this section merely provide background information related to the present disclosure and may not constitute prior art.

Electronic equipment often generates electromagnetic signals in one portion of the electronic equipment that may radiate to and interfere with another portion of the electronic equipment. This electromagnetic interference (EMI) can cause degradation or complete loss of important signals, thereby rendering the electronic equipment inefficient or inoperable. To reduce the adverse effects of EMI, electrically conducting (and sometimes magnetically conducting) material is interposed between the two portions of the electronic circuitry for absorbing and/or reflecting EMI energy. This shielding may take the form of a wall or a complete enclosure and may be placed around the portion of the electronic circuit generating the electromagnetic signal and/or may be placed around the portion of the electronic circuit that is susceptible to the electromagnetic signal. For example, electronic circuits or components of a printed circuit board (PCB) are often enclosed with shields to localize EMI within its source, and to insulate other devices proximal to the EMI source.

As used herein, the term electromagnetic interference (EMI) should be considered to generally include and refer to both electromagnetic interference (EMI) and radio frequency interference (RFI) emissions, and the term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

SUMMARY

According to various aspects, exemplary embodiments are provided of shielding apparatus suitable for use in providing electromagnetic interference shielding for one or more electrical components on a substrate. In one exemplary embodiment, a shielding apparatus generally includes first and second walls. The first wall includes laterally spaced-apart detent protrusions. The second wall includes an edge portion disposed relative to the first wall such that an interface between the edge portion of the second wall and the first wall is substantially sealed against the ingress and/or egress of electromagnetic interference through the interface. The edge portion of the second wall is engaged generally between and laterally confined by the laterally spaced-apart detent protrusions of the first wall, such that the laterally spaced-apart detent protrusions help inhibit movement of the second wall relative to the first wall. Accordingly, this helps retain the interface between the edge portion of the second wall and the first wall substantially sealed against the ingress and/or egress of electromagnetic interference through the interface.

In another exemplary embodiment, a shielding apparatus generally includes outer walls configured for installation to a substrate generally about one or more electrical components on the substrate. Laterally spaced-apart detent protrusions are integrally formed in at least one of the outer walls. The laterally spaced-apart detent protrusions inwardly protrude and define a saddle therebetween. One or more internal walls are integrally formed with the outer walls. At least one of the one or more internal walls have an edge portion substantially abutting the at least one outer wall having the laterally spaced-apart detent. The edge portion is engagingly received within the saddle such that the laterally spaced-apart detent protrusions laterally confine the edge portion and help inhibit movement relative to the at least one outer wall. The engagement of the edge portion within the saddle helps retain substantial abutment of the edge portion to the at least one outer wall, thereby helping retain a closed-off EMI gap between the edge portion and the at least one outer wall sealed against ingress and/or egress of electromagnetic interference through the closed-off EMI gap.

Other aspects of the present disclosure include methods relating to EMI shielding apparatus. In one exemplary embodiment, there is provided a method of making an electromagnetic interference (EMI) shielding that generally includes first and second walls in which a juncture between the first and second walls is substantially sealed for inhibiting ingress and/or egress of EMI through the juncture. In this embodiment, the method generally includes positioning the second wall relative to the first wall such that an edge portion of the second wall is engaged generally between and laterally confined by laterally spaced-apart detent protrusions on the first wall. The laterally spaced-apart detent protrusions inhibit movement of the second wall relative to the first wall, thereby helping retain the substantially sealed juncture between the first and second walls.

In another exemplary embodiment, there is provided a method of retaining a closed seam between first and second walls of a shielding apparatus for inhibiting ingress and/or egress of electromagnetic interference (EMI) through the closed seam. In this embodiment, the method generally includes positioning the second wall relative to the first wall such that an edge portion of the second wall is engaged generally between and laterally confined by laterally spaced-apart detent protrusions on the first wall. The laterally spaced-apart detent protrusions inhibit movement of the second wall relative to the first wall, thereby helping the closed seam between the first and second walls remain closed.

In another exemplary embodiment, a method generally includes installing a shielding apparatus to a substrate such that outer walls of the shielding apparatus are disposed generally about one or more electrical components on the substrate. At least one of the outer walls includes laterally spaced-apart detent protrusions. The shielding apparatus includes at least one internal wall having an edge portion engaged generally between and laterally confined by laterally spaced-apart detent protrusions on at least one of the outer walls, such that the laterally spaced-apart detent protrusions inhibit movement of the at least one internal wall relative to the at leas one outer wall.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 4 is a partial cross-sectional view taken along the indicated plane shown in FIG. 3, and illustrating engagement/lateral confinement of an internal wall by dimples of an outer wall;

FIG. 5 is a partial cross-sectional view taken along the indicated plane shown in FIG. 3, and further illustrating the engagement/lateral confinement of the internal wall by the dimples of the outer wall;

Figure 6:
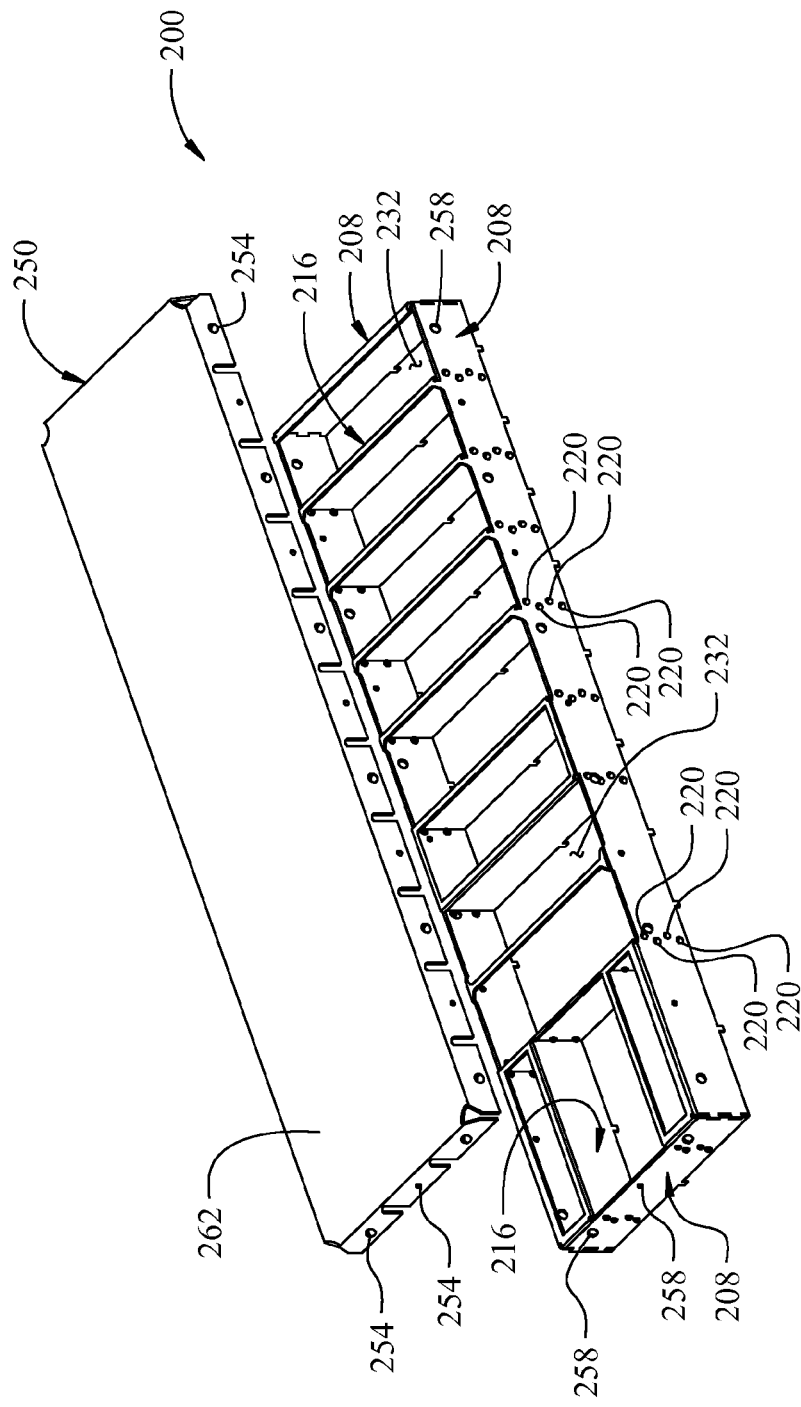
Figure 7:
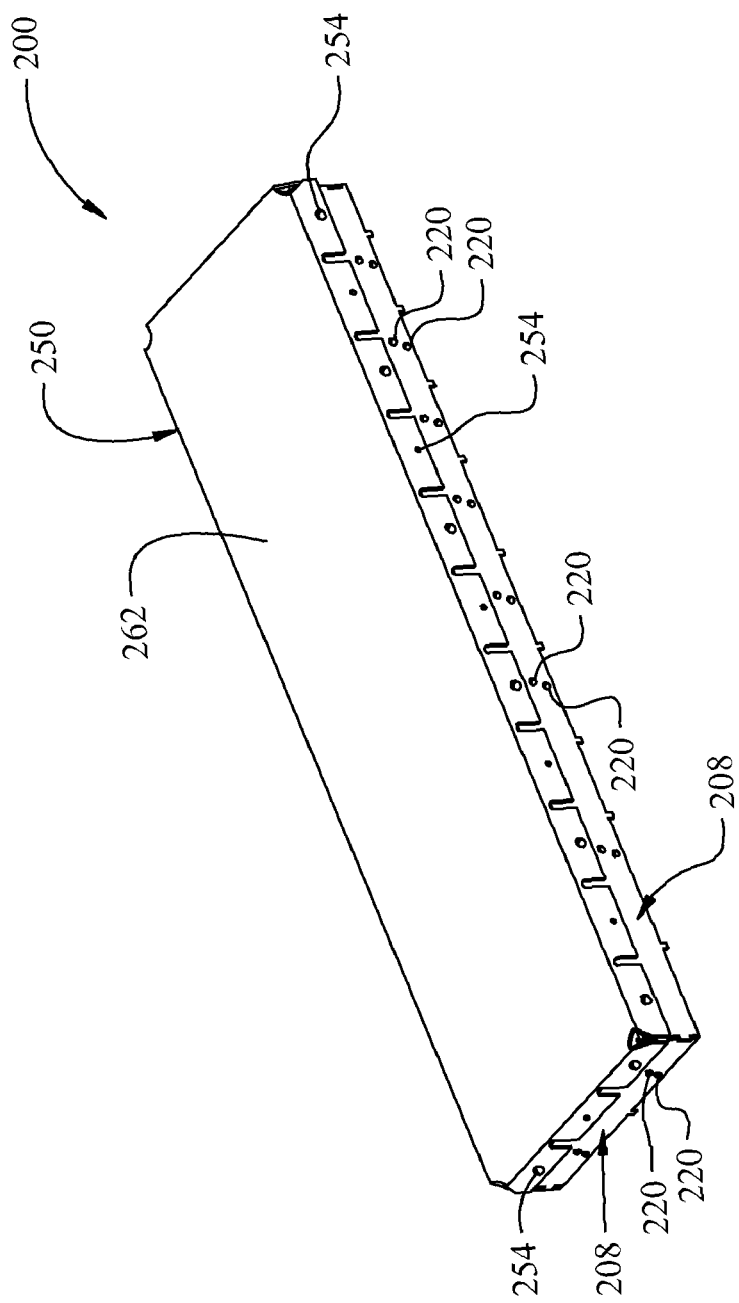

FIG. 6 is an exploded perspective view of an exemplary shielding apparatus and an exemplary lid, which may be attached to the shielding apparatus for covering the open top of the shielding apparatus according an exemplary embodiment; and FIG. 7 is a perspective view of the shielding apparatus and lid shown in FIG. 6 with the lid attached to the shielding apparatus and covering the open top of the shielding apparatus.

DETAILED DESCRIPTION

The following description is merely exemplary in nature and is not intended to limit the present disclosure, application, or uses. It should be understood that throughout the drawings, corresponding reference numerals indicate like or corresponding parts and features.

According to various aspects, exemplary embodiments are provided of shielding apparatus (e.g., frames, etc.) suitable for use in providing electromagnetic interference (EMI) shielding for one or more electrical components on a substrate (e.g., printed circuit board, etc.). In one exemplary embodiment, a shielding apparatus generally includes a first wall (e.g., outer wall, sidewall, etc.) and a second wall (e.g., internal wall, interior partition wall, etc.). The first wall has laterally spaced-apart detent protrusions (e.g., dimples, half-dimples, catches, lugs, ribs, projections, protrusions, ridges, bumps, detents, protrusions, etc.). The second wall has an edge portion (e.g., side edge, etc.) disposed relative to (e.g., abutting, flush against, immediately adjacent, etc.) the first wall (e.g., an inner side of the first wall, etc.) such that an interface, juncture, or seam between the second wall's edge portion and first wall is substantially sealed or closed off such that the ingress and/or egress of electromagnetic interference through the interface is inhibited (e.g., prevented, reduced, etc.). In addition, the second walls' edge portion is engaged generally between and laterally confined by the laterally spaced-apart detent protrusions of the first wall. This engagement/lateral confinement by laterally spaced-apart detent protrusions help inhibit movement of the second wall relative to the first wall, thereby helping retain the substantially sealed interface, juncture, or seam between the second wall's edge portion and the first wall.

In various embodiments, a shielding apparatus includes sidewalls with dimples configured to allow an edge portion of an internal formed wall to rest in a saddle defined by the dimples, to close off or substantially seal (e.g., inhibit ingress and/or egress of EMI, etc.) EMI gaps along the interface, seam, or juncture between the internal wall and the sidewall. With the edge portion of the internal wall laterally confined by the dimples, movement of the internal wall relative to the sidewall is inhibited. In some embodiments, this may also or alternatively help the internal wall remain substantially vertical relative to the substrate (e.g., printed circuit board, etc.) to which the shield is attached, thus helping close off or substantially seal EMI gaps along the interface, seam, juncture between the bottom edge of the internal wall and In some embodiments, the dimples are monolithically, or integrally, formed in one or more sidewalls such that the closing off or sealing of EMI gaps may be accomplished without requiring or needing the addition of any additional pieces and/or processes, such as spot welding individual parts. In other embodiments, however, one or more dimples or other protrusions may be discrete components attached to a sidewall. In embodiments in which the dimples (or other suitable protrusions) are monolithically or integrally formed in a sidewall, such embodiments may allow for reduced part counts and less welding than would have been otherwise required to assemble the various parts. Various embodiments disclosed herein may allow a frame or other EMI shielding component shield to be manufactured using an automated process, such as progressive die, etc.

Some embodiments include a board level shield (BLS) (e.g., frame, etc.) having internal walls and outer sidewalls that cooperatively define a plurality of individual EMI shielding compartments. When the BLS frame is installed (soldered, etc.) to a substrate (e.g., printed circuit board, etc.) having electronic components on the substrate, the electronic components are positioned in different compartments such that the components are provided with EMI shielding by virtue of the EMI shielding compartments inhibiting the ingress and/or egress of EMI into and/or out of each EMI shielding compartment. In such embodiments, the engagement or nesting of the internal walls with lateral detent protrusions (e.g., dimples, etc.) laterally confine the internal walls within the laterally spaced distance or saddle defined generally between the lateral detent protrusions. The nesting or engagement of the internal walls (e.g., integrally formed bent down walls, etc.) within the saddle defined by the lateral detent protrusions helps close off or seal any EMI gap that might otherwise exist between the side edges of the internal walls and the outer sidewalls, without adding additional pieces and processes such as welding.

Figure 1:
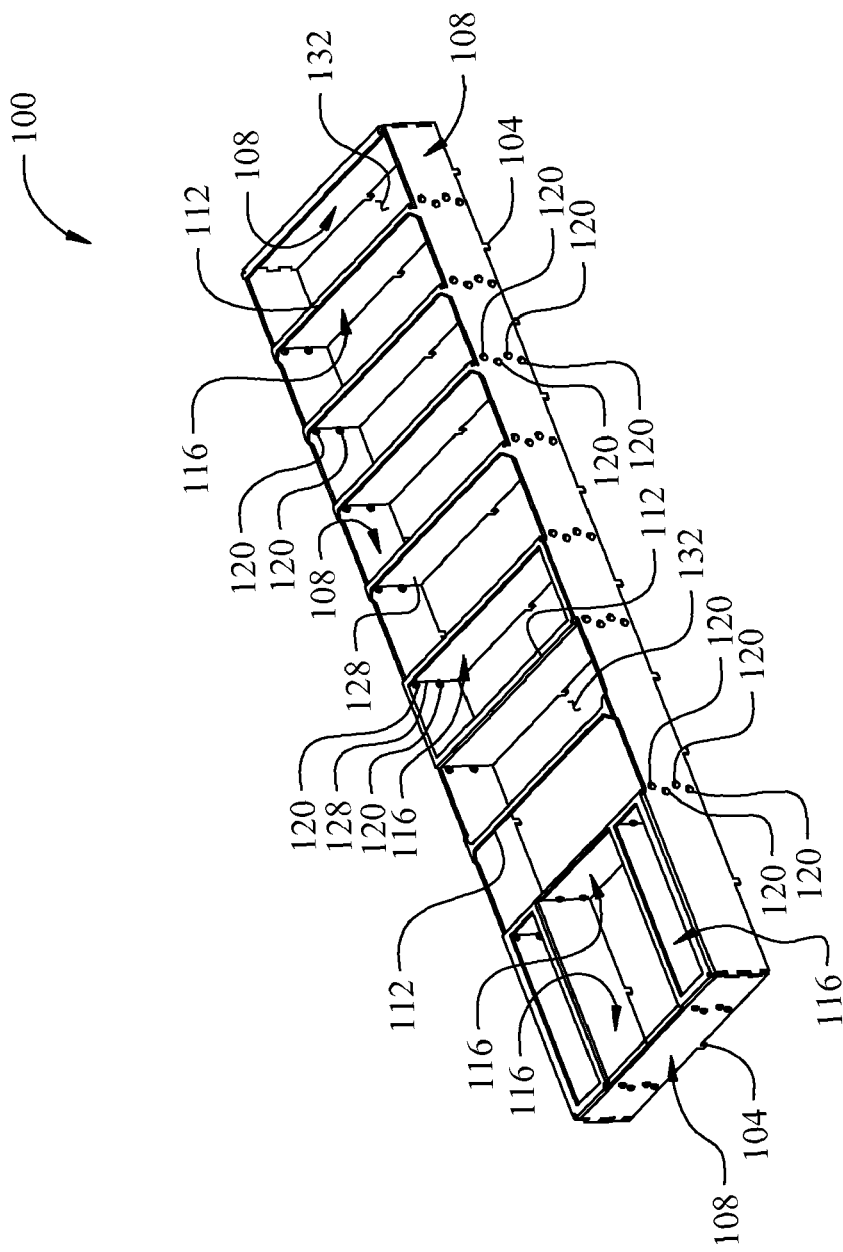
FIG. 1 is a perspective view of an exemplary board level shielding apparatus according to an exemplary embodiment.

Referring now to the drawings, FIGS. 1 through 5 illustrate an exemplary embodiment of a shielding apparatus 100 embodying one or more aspects of the present disclosure. As shown in FIG. 1, the shielding apparatus 100 generally includes outer walls or sidewalls 108, cross bracing 112, and internal, or interior, partition/divider walls 116 disposed within a perimeter defined by the outer walls 108 of the apparatus 100.

The outer walls 108 of the illustrated shielding apparatus 100 generally include laterally spaced-apart detent protrusions, which in the illustrated embodiment includes first and second pairs of upper and lower inwardly protruding and vertically-aligned dimples (each dimple being indicated at 120). The internal walls 116 may also include laterally spaced-apart detent protrusions even though the following description describes the protrusions only with regard to the outer walls 108. In the illustrated embodiment, the dimples 120 are integrally (or monolithically) formed with the outer walls 108. And one pair of dimples 120 may be disposed higher than a corresponding second pair of dimples 120. The first and second pairs of dimples 120 generally define saddles, or spaces, therebetween that engagingly receive edge portions 128 of the internal walls 116 (e.g., FIGS. 4 and 5, etc.). The engagement, or nesting, of the internal walls 116 with the lateral detent protrusions (e.g., between dimples 120 of the first and second pairs of dimples 120, etc.) can laterally confine the internal walls 116 within the laterally spaced distance, or saddle, defined generally between the lateral detent protrusions. In the illustrated embodiment, the nesting or engagement of the edge portions 128 of the internal walls 116 within the saddles laterally confines the internal walls 116 via the dimples 120 (e.g., between the laterally spaced dimples 120, etc.). For example, as shown in FIGS. 4 and 5, the dimples 120 may help keep the internal walls 116 substantially flush against or in substantial abutment with the outer walls 108 such that a substantially closed seam, or interface, is defined therebetween. This, in turn, helps close off and/or seal EMI gaps (and keep the EMI gaps closed and/or sealed, for example, against the ingress and/or egress of EMI through an interface between the walls 108, 116) that might otherwise exist between the edge portions 128 of the internal walls 116 and the outer sidewalls 108. Alternative embodiments may include other means for laterally confining the internal walls relative to the outer walls, such as dimples in a different configuration (e.g., shape, size, number of, location, etc.), half-dimples, catches, lugs, ribs, projections, protrusions, ridges, bumps, detents, protrusions, other locking features, etc.

Figure 2:
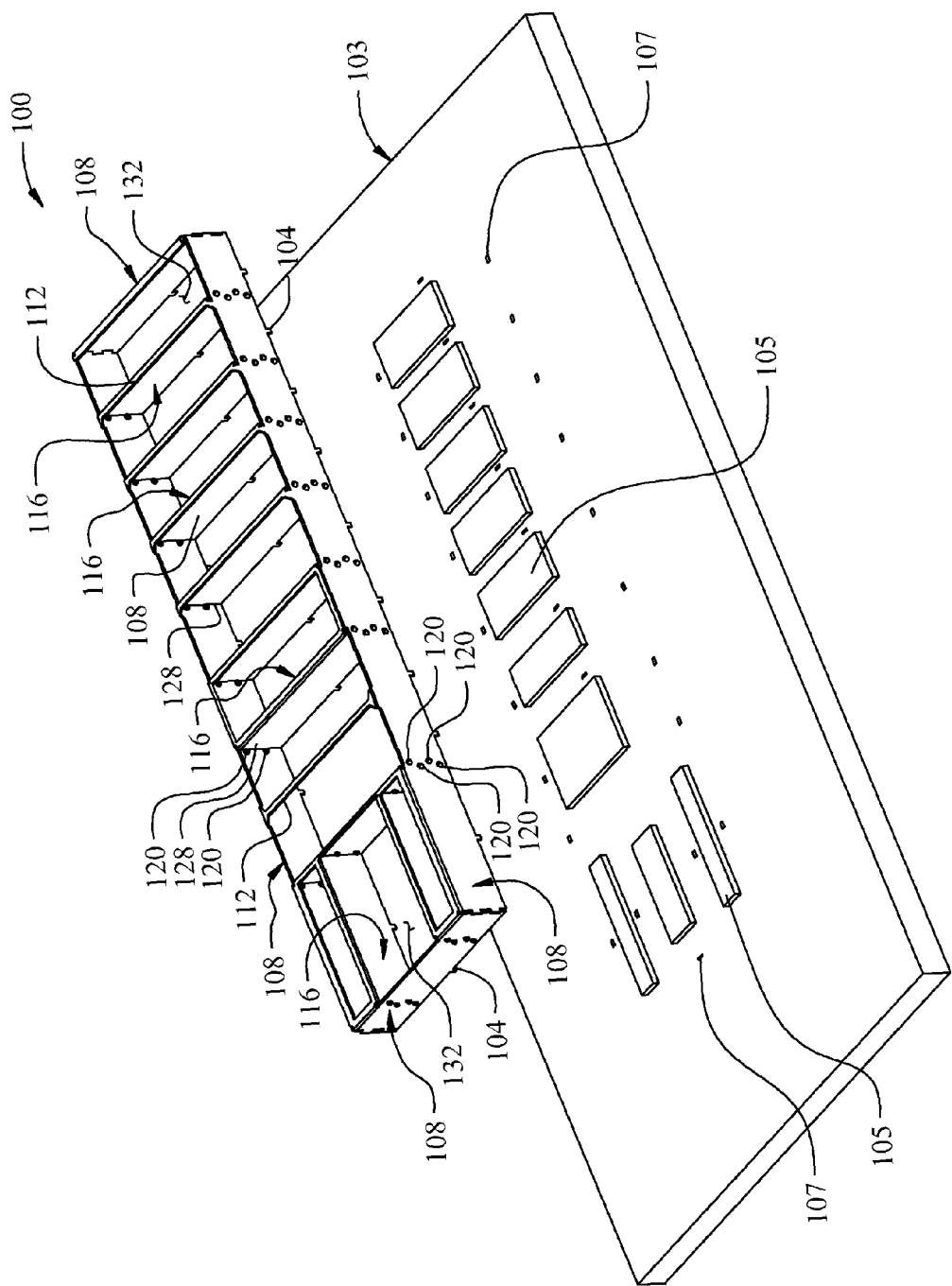
FIG. 2 is a perspective view showing the shielding apparatus of FIG. 1 positioned relative to a printed circuit board for installation thereto, with shielding compartments of the shielding apparatus aligned for receiving the PCB electronic components according to an exemplary embodiment.

As shown in FIG. 2, the shielding apparatus 100 may be installed (e.g., surface mounted, soldered, mechanically fastened, secured, etc.) to a printed circuit board 103 and is suitable for use in providing electromagnetic interference (EMI) shielding to one or more electrical components 105 mounted on the PCB 103. In other embodiments, a shielding apparatus may be installed to other substrates besides printed circuit boards, as a printed circuit board is but one example type of substrate to which the shielding apparatus disclosed herein may be installed.

To facilitate alignment of the shielding apparatus 100 with the PCB 103 during installation, the shielding apparatus 100 may include one or more legs, projections, or members 104 configured to be received in corresponding openings 107 of the PCB 103. With the shielding apparatus 100 positioned on the PCB 103 with legs 104 within the openings 103, soldering may then be used to secure the shielding apparatus 100 to the PCB 103. Alternatively, other suitable methods and means may be used for installing the shielding apparatus 100 to the PCB 103, such as mechanical fasteners, etc. In addition, other embodiments of the shielding apparatus may not include any such legs 104. Additional embodiments may include a shielding apparatus that is used with a differently configured PCB than what is shown in FIG. 2, such as a PCB without any openings 107 and/or a PCB with differently configured electronic components 105 (e.g., more or less components, differently arranged components, etc.). Accordingly, a shielding apparatus disclosed herein should not be limited in use with only the particular PCB configuration and/or electronic component layout shown in FIG. 2.

The outer walls 108 and internal walls 116 are configured to generally surround certain electrical components 105 on the PCB 103 when the shielding apparatus 100 is installed to the PCB 103. In the illustrated shielding apparatus 100, the outer walls 108 and internal walls 116 define openings 132 along an upper portion of the shielding apparatus 100 that may be used, for example, to access the certain electrical components 105 on the PCB 103 contained within the shielding apparatus 100 after the shielding apparatus 100 is installed to the PCB 103. Thus, the illustrated shielding apparatus 100 may be viewed as an open-top EMI shielding can or frame. In other exemplary embodiments, shielding apparatus may include walls defining more or less openings than disclosed herein.

Figure 3:
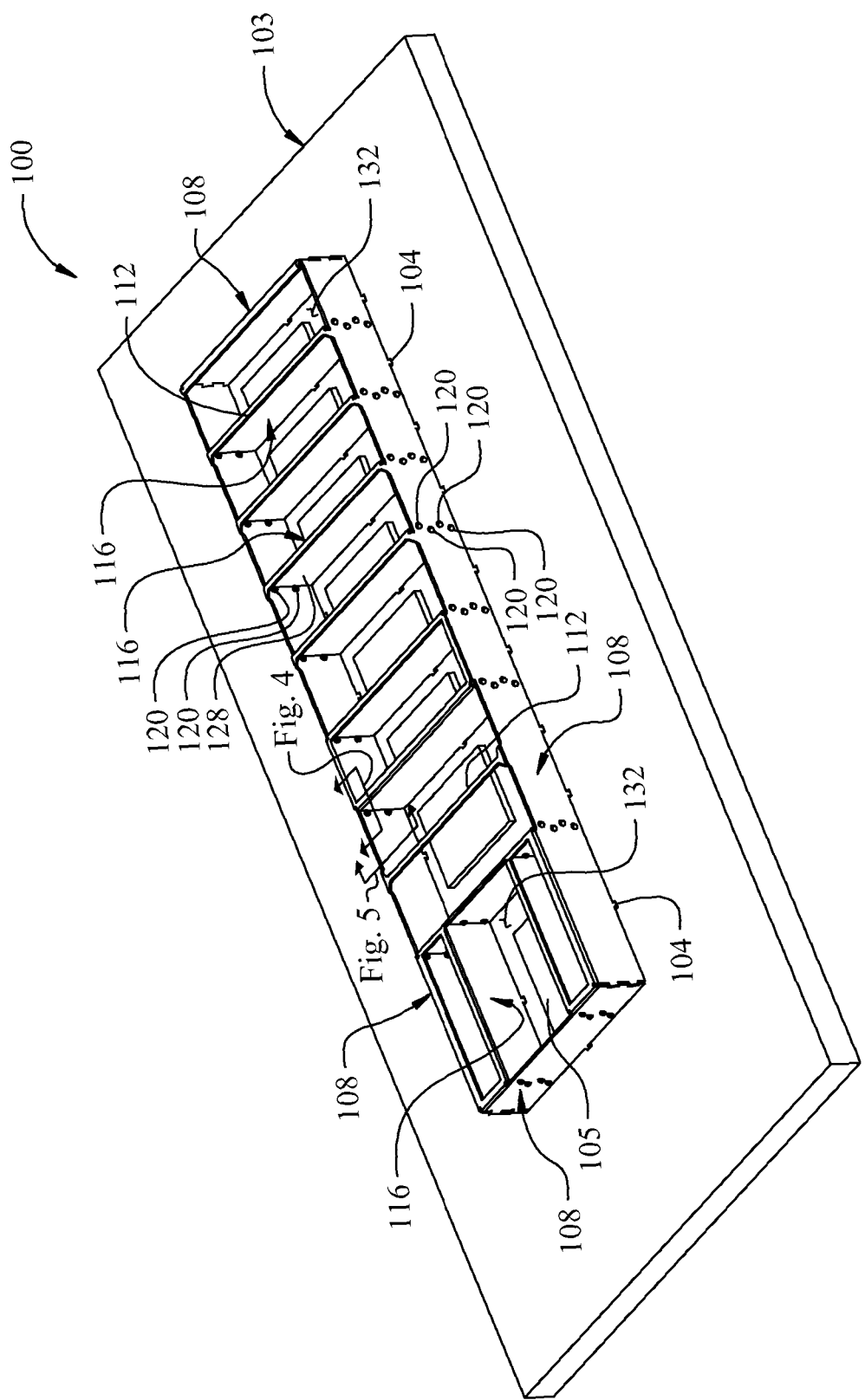
FIG. 3 is a perspective view showing the shielding apparatus installed to the PCB shown in FIG. 2.

As shown in FIGS. 1 through 3, the illustrated shielding apparatus 100 is generally rectangular in shape and generally includes four sidewalls 108, eight internal walls 116, and cross bracing 112 extending generally between the walls 108, 116. The outer walls 108 and internal walls 116 are substantially planar in shape. Adjacent outer walls 108 are oriented generally at right angles to each other, and opposing outer walls 108 are generally parallel, thereby producing the generally rectangular shape of the shielding apparatus 100. The walls 108 and 116 together generally define rectangular compartments for surrounding and/or shielding the electrical components 105 on the PCB 103. The cross bracing 112 extends generally between two opposing, longitudinally extending outer walls 108 as well as between an end outer wall 108 and a generally parallel extending internal wall 116 to help rigidify the assembly 100. The cross bracing 112 may be configured differently within the scope of the present disclosure. With additional reference to FIGS. 4 and 5, the internal walls 116 are also oriented at generally right angles to the corresponding outer wall 108 they engage, such that the shielding apparatus 100 defines the generally rectangular EMI shielding compartments defined therein. In other exemplary embodiments, shielding apparatus may include more than or fewer than four outer walls, and/or more than or fewer than eight internal walls, and/or outer walls and/or internal walls in a configuration different from that disclosed herein. For example, the outer walls may have square configurations, triangular configurations, hexagonal configurations, other polygonal-shaped configurations, circular configurations, non-rectangular configurations, etc. In still other exemplary embodiments, shielding apparatus may include non-rectangular EMI shielding compartments.

The illustrated shielding apparatus 100 also has an integral (or monolithic) construction (e.g., from a single blank of material, etc.). Upper portions of the internal walls 116 integrally define at least some of the cross bracing 112. And the outer walls 108, the internal walls 116, and the cross bracing 112 are generally formed as one piece of material. Accordingly, at some locations the internal walls 116 depend downwardly (e.g., bent, folded, drawn, etc.) from the cross bracing 112 to generally position between dimples 120 of first and second pairs of dimples 120. Alternative exemplary embodiments may include one or more components of a shielding apparatus being formed as a discrete component that is attached to the shielding apparatus. And further exemplary embodiments may not include cross bracing. In still other exemplary embodiments, a shielding apparatus may have a non-rectangular shape, may include more or less outer walls, more or less interior, or internal, partition/divider walls more or less interior EMI shielding compartments, and/or EMI shielding compartments shaped differently than disclosed herein. For example, a shielding apparatus may be free of interior partition/divider walls such that the shielding apparatus generally defines a single interior space (or compartment) for shielding one or more electrical components on a PCB.

The shielding apparatus 100 may be advantageously formed generally by drawing at least part of the shielding apparatus 100, for example, over a die, to produce the final desired shape, for example, of a frame (as shown in FIG. 1), etc. And as previously stated, the shielding apparatus 100 is configured (e.g., sized, shaped, etc.) to be installed (e.g., surface mounted, secured, etc.) to the PCB 103 by any acceptable means such as soldering, mechanical fastening, etc.

The shielding apparatus 100 may be formed from a single piece of electrically-conductive material so that the outer walls 108, cross bracing 112, internal walls 116, and dimples 120 have an integral, monolithic construction. A wide range of electrically-conductive materials may be used to form the shielding apparatus 100. By way of example, the shielding apparatus 100 may be formed from cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. In addition, the shielding apparatus 100 may be formed from a plastic material coated with electrically-conductive material. In one exemplary embodiment, a shielding apparatus includes a frame formed from a sheet of cold rolled steel having a thickness of about 0.20 millimeters. As another example, a shielding apparatus may include a frame configured from a suitable material having a thickness in the range of about 0.10 millimeters and about 0.30 millimeters. The materials and dimensions provided herein are for purposes of illustration only, as a frame may be configured from different materials and/or with different dimensions depending, for example, on the particular application, such as the electrical components to be shielded, space considerations within the overall electronic device, EMI shielding and heat dissipation needs, and other factors.

FIGS. 6 and 7 illustrate another exemplary embodiment of a shielding apparatus 200 embodying one or more aspects of the present disclosure. As shown in FIG. 6, a lid or cover 250 is attachable to the shielding apparatus 200 of this embodiment for substantially covering openings 232 defined along the upper portion of the shielding apparatus 200 by outer walls 208 and internal walls 216. The lid 250 includes a generally rectangular shape corresponding to the generally rectangular shape of the shielding apparatus 200 as defined by the outer walls 208. The lid 250 is configured to fit generally over the shielding apparatus 200 (FIG. 7) for covering the openings 232 defined by the walls 208, 216. At which point, the shielding apparatus 200 and lid 250 may provide shielding to the one or more electrical components on a PCB (e.g., components 105 on PCB 103 shown in FIGS. 2 and 3, etc.) disposed within the area cooperatively defined by the shielding apparatus 200, the lid 250, and the PCB.

In this particular embodiment, the lid 250 is removably attachable to the shielding apparatus 200 by engaging dimples 254 of the lid 250 within openings 258 of the shielding apparatus 200. The lid 250 may be formed at least partly by bending, stamping, folding, etc. the lid 250 to produce the final desired shape. The lid 250 is configured to be releasably attached to the shielding apparatus 200 so that, together, the shielding apparatus 200 and the lid 250 may enclose the desired electrical components and provide EMI shielding thereto.

With the lid 250 attached to the shielding apparatus 200 (FIG. 7), the lid 250 and shielding apparatus 200 cooperatively define EMI shielding compartments within perimeters defined by the walls 208, 216 of the shielding apparatus 200. The outer walls 208 and internal walls 216 of the shielding apparatus 200 and the lid's planar top surface 262 cooperate to define the EMI shielding compartments. Plus, engagement of the internal walls 216 with dimples 220 of the outer walls 208 helps retain the relative position of the internal walls 216 to the walls 208, thus helping seal and/or reduce the size of EMI gaps therebetween. This, in turn, helps inhibit the ingress and/or egress and/or leakage of EMI through any junctures between the internal walls 216 and walls 208. Thus, EMI is preferably contained within each EMI shielding compartment and not allowed to escape therefrom.

The lid 250 may be formed from a wide range of materials, which are preferably electrically-conductive materials. For example, the lid 250 may be formed from cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. The lid 250 may also be formed from a plastic material coated with electrically-conductive material. In one exemplary embodiment, the lid is formed from a sheet of cold rolled steel having a thickness of about 0.15 millimeters. As another example, a lid may be configured from a suitable material having a thickness in the range of about 0.05 millimeters and about 0.30 millimeters. The materials and dimensions provided herein are for purposes of illustration only, as a cover may be configured from different materials and/or with different dimensions depending, for example, on the particular application, such as the electrical components to be shielded, space considerations within the overall electronic device, EMI shielding and heat dissipation needs, and other factors.

Attachment of the lid 250 to the shielding apparatus 200 will now be described. The shielding apparatus 200 may initially be installed to the PCB. The lid 250 may then be positioned over the shielding apparatus 200 and moved downward onto the shielding apparatus 200 to facilitate attachment of the lid 250 thereto. With this downward movement, the dimples 254 of the lid 250 engage the openings 258 of the shielding apparatus 200 and help secure the lid 250 to the shielding apparatus 200.

When or if the lid 250 is to be detached from the shielding apparatus 200, the lid 250 may be removed vertically from the shielding apparatus 200. For example, a shim (or other suitable tool) may be manually used to disengage the dimples 254 from the holes 258.

In some exemplary embodiments, the upper surface 262 of the lid 250 may include a plurality of apertures or holes, which may facilitate solder reflow heating interiorly of the lid 250, which may enable cooling of the electrical components beneath the lid 250, and/or which may permit visual inspection of members of the electrical components beneath the lid 250. In some of these exemplary embodiments, the lid 250 may include holes that are sufficiently small to inhibit passage of interfering EMI. The particular number, size, shape, orientation, etc. of the holes may vary depending, for example, on the particular application (e.g., sensitivity of the electronics where more sensitive circuitry may necessitate the use of smaller diameter holes, etc.). In still other exemplary embodiments, shielding apparatus may include covers without any such holes.

In some other exemplary embodiments, the upper surface 262 of the lid 250 may include a generally central pick-up surface configured for use in handling the lid 250 with pick-and-place equipment (e.g., vacuum pick-and-place equipment, etc.). The pick-up surface may be configured for use as a pick-up area that may be gripped or to which suction may be applied by the pick-and-place equipment for handling during, for example, fabrication of the lid 250 and/or installation of the lid 250 to a PCB. The central location of the pick-up surface may allow for balanced manipulation of the lid 250 during handling of the cover. In other exemplary embodiments, a lid may include covers with, for example, tabs at corners and/or along side edges for use as pick-up surfaces in addition to or in place of centrally located pick-up surfaces.

Alternative exemplary embodiments of shielding apparatus may include a differently configured lid with a different shape (e.g., non-rectangular, etc.), a different attachment method (e.g., welding, fixed attachment method, etc.), a different size (e.g., sized to cover less than all of the openings of the shielding apparatus, etc.), etc. depending, for example, on the particular application. Still other embodiments of shielding apparatus may not include any lid, such as embodiments in which a portion of a housing of an electrical device is used for covering openings defined along an upper portion of the shielding apparatus. Still further embodiments may include a lid that is an integral part of the shielding apparatus such that it would not be necessary to separately produce and attach a lid to the shielding apparatus.

Numerical dimensions and values are provided herein for illustrative purposes only. The particular dimensions and values provided are not intended to limit the scope of the present disclosure.

Certain terminology is used herein for purposes of reference only, and thus is not intended to be limiting. For example, terms such as "upper," "lower," "above," "below," "top," "bottom," "upward," "downward," "upwardly," and "downwardly" refer to directions in the drawings to which reference is made. Terms such as "front," "back," "rear," "bottom," and "side," describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second," and other such numerical terms referring to structures do not imply a sequence or order unless clearly indicated by the context.

When introducing elements or features and the exemplary embodiments, the articles "a," "an," "the," and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A shielding apparatus for use in providing electromagnetic interference (EMI) shielding for one or more electrical components on a substrate, the shielding apparatus comprising:
    a first wall having laterally spaced-apart detent protrusions;
    a second wall having an edge portion disposed relative to the first wall such that an interface between the edge portion of the second wall and the first wall is substantially sealed against the ingress and/or egress of electromagnetic interference through the interface;
    the edge portion of the second wall engaged generally between and laterally confined by the laterally spaced-apart detent protrusions of the first wall, such that the laterally spaced-apart detent protrusions help inhibit movement of the second wall relative to the first wall, thereby helping retain the interface between the edge portion of the second wall and the first wall substantially sealed against the ingress and/or egress of electromagnetic interference through the interface;
    wherein the laterally spaced-apart detent protrusions cooperatively define a saddle in which the edge portion of the second wall is engagably received.

2. The shielding apparatus of claim 1, wherein the edge portion of the second wall abuts the first wall, and wherein the engagement of the edge portion of the second wall with the laterally spaced-apart detent protrusions helps retain abutment of the second wall to the first wall.

3. The shielding apparatus of claim 1, wherein the edge portion of the second wall abuts the first wall such that a substantially closed seam is defined along the interface of the edge portion of the second wall to the first wall, and wherein the engagement of the edge portion of the second wall with the laterally spaced-apart detent protrusions helps retain the seam in a closed configuration.

4. The shielding apparatus of claim 1, further comprising outer walls and one or more interior partition walls cooperatively defining at least a portion of two or more EMI shielding compartments within a perimeter defined by the outer walls, and wherein the first wall comprises at least one of said outer walls, and wherein the second wall comprises at least one of said one or more interior partition walls.

5. The shielding apparatus of claim 1, further comprising outer walls configured for installation to a substrate generally about one or more electrical components on the substrate, and one or more interior walls disposed within a perimeter defined by the outer walls, and wherein the first wall comprises at least one of said outer walls, and wherein the second wall comprises at least one of said one or more interior partition walls.

6. The shielding apparatus of claim 1, wherein the first wall, laterally spaced-apart detent protrusions, and second wall are integrally formed.

7. The shielding apparatus of claim 1, wherein the first wall, laterally spaced-apart detent protrusions, and second wall are monolithically formed from a single blank of material.

8. The shielding apparatus of claim 1, wherein the shielding apparatus includes:
    a frame having walls defining at least one opening along an upper portion of the frame, the walls being configured to generally surround the one or more electrical components on the substrate, and one or more interior walls, wherein the first wall comprises at least one of said walls, and wherein the second wall comprises at least one of said one or more interior walls; and
    a lid attachable to the frame, for substantially covering the at least one opening of the frame;
    whereby the shielding apparatus is operable for shielding the one or more electrical components on the substrate that are within an interior cooperatively defined by the frame, the lid, and the substrate.

9. The shielding apparatus of claim 1, wherein the second wall is generally perpendicular to the first wall.

10. An electrical device including a printed circuit board and the shielding apparatus of claim 1 attached to the printed circuit board.

11. A shielding apparatus for use in providing electromagnetic interference (EMI) shielding for one or more electrical components on a substrate, the shielding apparatus comprising:
- a first wall having laterally spaced-apart detent protrusions;
- a second wall having an edge portion disposed relative to the first wall such that an interface between the edge portion of the second wall and the first wall is substantially sealed against the ingress and/or egress of electromagnetic interference through the interface;
- the edge portion of the second wall engaged generally between and laterally confined by the laterally spaced-apart detent protrusions of the first wall, such that the laterally spaced-apart detent protrusions help inhibit movement of the second wall relative to the first wall, thereby helping retain the interface between the edge portion of the second wall and the first wall substantially sealed against the ingress and/or egress of electromagnetic interference through the interface;
- wherein the laterally spaced-apart detent protrusions include upper and lower vertically-aligned detent protrusions along a first side of the edge portion, and upper and lower vertically-aligned detent protrusions along a second side of the edge portion.

12. The shielding apparatus of claim 11, wherein the upper and lower detent protrusions along the first side are disposed higher than the corresponding upper and lower detent protrusions along the second side.

13. The shielding apparatus of claim 11, wherein the laterally spaced-apart detent protrusions cooperatively define a saddle in which the edge portion of the second wall is engagably received.

14. A shielding apparatus for use in providing electromagnetic interference (EMI) shielding for one or more electrical components on a substrate, the shielding apparatus comprising:
- a first wall having laterally spaced-apart detent protrusions;
- a second wall having an edge portion disposed relative to the first wall such that an interface between the edge portion of the second wall and the first wall is substantially sealed against the ingress and/or egress of electromagnetic interference through the interface;
- the edge portion of the second wall engaged generally between and laterally confined by the laterally spaced-apart detent protrusions of the first wall, such that the laterally spaced-apart detent protrusions help inhibit movement of the second wall relative to the first wall, thereby helping retain the interface between the edge portion of the second wall and the first wall substantially sealed against the ingress and/or egress of electromagnetic interference through the interface;
- wherein the laterally spaced-apart detent protrusions are staggered such that the laterally spaced-apart detent protrusions are not laterally disposed directly across from each other.

15. A shielding apparatus for use in providing electromagnetic interference (EMI) shielding for one or more electrical components on a substrate, the shielding apparatus comprising:
- a first wall having laterally spaced-apart detent protrusions;
- a second wall having an edge portion disposed relative to the first wall such that an interface between the edge portion of the second wall and the first wall is substantially sealed against the ingress and/or egress of electromagnetic interference through the interface;
- the edge portion of the second wall engaged generally between and laterally confined by the laterally spaced-apart detent protrusions of the first wall, such that the laterally spaced-apart detent protrusions help inhibit movement of the second wall relative to the first wall, thereby helping retain the interface between the edge portion of the second wall and the first wall substantially sealed against the ingress and/or egress of electromagnetic interference through the interface;
- wherein the laterally spaced-apart detent protrusions include dimples.

16. A shielding apparatus or use in providing electromagnetic interference (EMI) shielding for one or more electrical components on a substrate, the shielding apparatus comprising:
- outer walls configured for installation to a substrate generally about one or more electrical components on the substrate;
- laterally spaced-apart detent protrusions integrally formed in at least one of said outer walls, the laterally spaced-apart detent protrusions inwardly protruding and defining a saddle therebetween;
- one or more internal walls integrally formed with the outer walls, at least one of said one or more internal walls having an edge portion substantially abutting the at least one outer wall having the laterally spaced-apart detent protrusions, the edge portion being engagingly received within the saddle such that the laterally spaced-apart detent protrusions laterally confine the edge portion and help inhibit movement relative to the at least one outer wall;
- the engagement of the edge portion within the saddle helps retain substantial abutment of the edge portion to the at least one outer wall, thereby helping retain a closed-off EMI gap between the edge portion and the at least one outer wall sealed against ingress and/or egress of electromagnetic interference through the closed-off EMI gap;
- wherein the laterally spaced-apart detent protrusions include upper and lower laterally spaced-apart detent protrusions along a first side of the saddle, and upper and lower laterally spaced-apart detent protrusions along a second side of the saddle.

17. The shielding apparatus of claim 16, wherein the outer wall having the laterally spaced-apart detent protrusions and the internal wall engaged therewith cooperatively define at least a portion of two or more EMI shielding compartments within a perimeter defined by the outer walls.

18. The shielding apparatus of claim 16, further comprising a lid attachable to the outer walls for substantially covering at least one opening defined by the outer walls, whereby the shielding apparatus is operable for shielding the one or more electrical components on the substrate that are within an interior cooperatively defined by the frame, the lid, and the substrate.

19. An electrical device including a printed circuit board and the shielding apparatus of claim 16 attached to the printed circuit board.

20. A shielding apparatus or use in providing electromagnetic interference (EMI) shielding for one or more electrical components on a substrate, the shielding apparatus comprising:

outer walls configured for installation to a substrate generally about one or more electrical components on the substrate;

laterally spaced-apart detent protrusions integrally formed in at least one of said outer walls, the laterally spaced-apart detent protrusions inwardly protruding and defining a saddle therebetween;

one or more internal walls integrally formed with the outer walls, at least one of said one or more internal walls having an edge portion substantially abutting the at least one outer wall having the laterally spaced-apart detents, the edge portion being engagingly received within the saddle such that the laterally spaced-apart detent protrusions laterally confine the edge portion and help inhibit movement relative to the at least one outer wall;

the engagement of the edge portion within the saddle helps retain substantial abutment of the edge portion to the at least one outer wall, thereby helping retain a closed-off EMI gap between the edge portion and the at least one outer wall sealed against ingress and/or egress of electromagnetic interference through the closed-off EMI gap;

wherein the laterally spaced-apart detent protrusions include a first pair of upper and lower vertically-aligned detent protrusions and a second pair of upper and lower vertically-aligned detent protrusions, the first and second pairs being laterally spaced apart.

21. The shielding apparatus of claim 20, wherein the upper and lower detent protrusions of the first pair are disposed higher than the corresponding upper and lower detent protrusions of the second pair.

22. A shielding apparatus or use in providing electromagnetic interference (EMI) shielding for one or more electrical components on a substrate, the shielding apparatus comprising:

outer walls configured for installation to a substrate generally about one or more electrical components on the substrate;

laterally spaced-apart detent protrusions integrally formed in at least one of said outer walls, the laterally spaced-apart detent protrusions inwardly protruding and defining a saddle therebetween;

one or more internal walls integrally formed with the outer walls, at least one of said one or more internal walls having an edge portion substantially abutting the at least one outer wall having the laterally spaced-apart detents, the edge portion being engagingly received within the saddle such that the laterally spaced-apart detent protrusions laterally confine the edge portion and help inhibit movement relative to the at least one outer wall;

the engagement of the edge portion within the saddle helps retain substantial abutment of the edge portion to the at least one outer wall, thereby helping retain a closed-off EMI gap between the edge portion and the at least one outer wall sealed against ingress and/or egress of electromagnetic interference through the closed-off EMI gap;

wherein the laterally spaced-apart detent protrusions are staggered such that the laterally spaced-apart detent protrusions are not laterally disposed directly across from each other.

23. A shielding apparatus or use in providing electromagnetic interference (EMI) shielding for one or more electrical components on a substrate, the shielding apparatus comprising:

outer walls configured for installation to a substrate generally about one or more electrical components on the substrate;

laterally spaced-apart detent protrusions integrally formed in at least one of said outer walls, the laterally spaced-apart detent protrusions inwardly protruding and defining a saddle therebetween;

one or more internal walls integrally formed with the outer walls, at least one of said one or more internal walls having an edge portion substantially abutting the at least one outer wall having the laterally spaced-apart detents, the edge portion being engagingly received within the saddle such that the laterally spaced-apart detent protrusions laterally confine the edge portion and help inhibit movement relative to the at least one outer wall;

the engagement of the edge portion within the saddle helps retain substantial abutment of the edge portion to the at least one outer wall, thereby helping retain a closed-off EMI gap between the edge portion and the at least one outer wall sealed against ingress and/or egress of electromagnetic interference through the closed-off EMI gap;

wherein the laterally spaced-apart detent protrusions include dimples.

24. The shielding apparatus of claim 23, wherein the laterally spaced-apart detent protrusions includes upper and lower laterally spaced -apart detent protrusions along a first side of the saddle, and upper and lower laterally spaced-apart detent protrusions along a second side of the saddle.

25. A method of making an electromagnetic interference (EMI) shielding having first and second walls in which a juncture between the first and second walls is substantially sealed for inhibiting ingress and/or egress of EMI through the juncture, the method comprising:

positioning the second wall relative to the first wall such that an edge portion of the second wall is engaged generally between and laterally confined by laterally spaced-apart detent protrusions on the first wall, the laterally spaced-apart detent protrusions inhibiting movement of the second wall relative to the first wall, thereby helping retain the substantially sealed juncture between the first and second walls, wherein the laterally spaced-apart detent protrusions include dimples.

26. The method of claim 25, wherein positioning the edge portion includes forming the second wall downwardly relative to an upper portion of the shielding apparatus.

27. The method of claim 25, wherein positioning the edge portion includes bending the second wall downwardly relative to an upper portion of the shielding apparatus.

28. The method of claim 25, wherein positioning the edge portion includes folding the second wall downwardly relative to an upper portion of the shielding apparatus.

29. The method of claim 25, wherein the method includes integrally forming the first wall, second wall, and laterally spaced-apart detent protrusions from a single blank of material 30. The method of claim 25, wherein the EMI shielding apparatus comprises a one-piece frame having the first wall with the laterally spaced-apart detent protrusions integrally formed therein, and the second wall integrally formed with the first wall.

31. The method of claim 25, wherein the method includes attaching a lid attachable to the frame for substantially covering at least one opening defined by the frame.

32. The method of claim 25, wherein engagement of the edge portion of the second wall with the laterally spaced-apart detent protrusions helps retain abutment of the second wall to the first wall.

33. The method of claim 25, wherein engagement of the edge portion of the second wall with the laterally spaced-apart detent protrusions helps close off an EMI gap along the juncture between the first and second walls.

34. The method of claim 25, further comprising stamping in a single piece of material a flat pattern partial profile for the shielding apparatus including the first and second walls and the laterally spaced-apart detent protrusions, and then forming the first and second walls at an angle relative to a top portion of the shielding apparatus, wherein forming includes positioning the edge portion of the second wall with a saddle defined generally between the laterally spaced-apart detent protrusions.

35. The method of claim 34, wherein forming includes one or more of drawing, bending, and folding.

36. A method of retaining a closed seam between first and second walls of a shielding apparatus for inhibiting ingress and/or egress of electromagnetic interference (EMI) through the closed seam, the method comprising:

positioning the second wall relative to the first wall such that an edge portion of the second wall is engaged generally between and laterally confined by laterally spaced-apart detent protrusions on the first wall, the laterally spaced-apart detent protrusions inhibiting movement of the second wall relative to the first wall, thereby helping the closed seam between the first and second walls remain closed, wherein the laterally spaced-apart detent protrusions include dimples.

37. A method relating to providing EMI shielding for one or more electrical components on a substrate, the method comprising:

installing a shielding apparatus to a substrate such that outer walls of the shielding apparatus are disposed generally about one or more electrical components on the substrate, at least one of said outer walls having laterally spaced-apart detent protrusions, the shielding apparatus including at least one internal wall having an edge portion engaged generally between and laterally confined by laterally spaced-apart detent protrusions on at least one of said outer walls, such that the laterally spaced-apart detent protrusions inhibit movement of the at least one internal wall relative to the at leas one outer wall, wherein the laterally spaced-apart detent protrusions include dimples.

38. The method of claim 37, further comprising attaching a lid to the outer walls of the shielding apparatus such that the lid substantially covers at least one opening defined by the outer walls.

* * * * *